United States Patent
Gamba et al.

(10) Patent No.: US 7,145,421 B2
(45) Date of Patent: Dec. 5, 2006

(54) DEVICE FOR SUPPLYING AN ELECTRONIC PROTECTION DEVICE TO BE USED IN A LOW-VOLTAGE CIRCUIT BREAKER

(75) Inventors: Federico Gamba, Bergamo (IT);
Severino Colombo, Dalmine (IT);
Francesco Casalinuovo, Cavernago (IT)

(73) Assignee: ABB Service S.R.L. (IT)

( * ) Notice: Subject to any disclaimer, the term of this patent is extended or adjusted under 35 U.S.C. 154(b) by 0 days.

(21) Appl. No.: 10/905,150

(22) Filed: Dec. 17, 2004

(65) Prior Publication Data

US 2005/0141159 A1 Jun. 30, 2005

(30) Foreign Application Priority Data

Dec. 30, 2003 (IT) .......................... BG2003A0062

(51) Int. Cl.
*H01F 17/06* (2006.01)
(52) U.S. Cl. ............................. 335/175; 335/6; 335/8; 335/18; 335/172
(58) Field of Classification Search ................ 335/18, 335/16, 132; 336/175–176
See application file for complete search history.

(56) References Cited

U.S. PATENT DOCUMENTS

| 4,037,183 | A | * | 7/1977 | Gaskill | ........................... 335/6 |
| 5,382,896 | A | * | 1/1995 | Schueller et al. | ........... 324/127 |
| 6,801,421 | B1 | * | 10/2004 | Sasse et al. | ................. 361/268 |
| 2003/0030528 | A1 | * | 2/2003 | Attarian et al. | ............. 336/175 |
| 2004/0136125 | A1 | * | 7/2004 | Nemir et al. | .................. 361/42 |

* cited by examiner

*Primary Examiner*—Ramon M. Barrera
(74) *Attorney, Agent, or Firm*—Connolly Bove Lodge & Hutz, LLP; Larry Hume

(57) ABSTRACT

A supply device (1) for an electronic protection device to be used in a low-voltage circuit breaker. The supply device basically comprises a primary conductor (11), a secondary winding (12), a first magnetic circuit (10), and at least one second magnetic circuit (20). The first magnetic circuit (10) is such as to surround said primary conductor (11), which is related to a phase protected by the protection device; at the same time, the first magnetic circuit (10) constitutes the core of said secondary winding (12) that is used for supply of the protection device. The second magnetic circuit (20) is structurally separated from the first magnetic circuit (10), but is operatively connected thereto for subtracting part of the first magnetic flux generated within it by the current circulating in the primary conductor (11).

22 Claims, 10 Drawing Sheets

DEVICE FOR SUPPLYING AN ELECTRONIC PROTECTION DEVICE TO BE USED IN A LOW-VOLTAGE CIRCUIT BREAKER

CROSS REFERENCE TO RELATED APPLICATIONS

This application claims priority from Italian Application BG2003A000062 filed on Dec. 30, 2003, the entire contents of which are incorporated herein by reference.

FIELD OF THE INVENTION

The present invention relates to a device for supplying an electronic protection device to be used in a low-voltage unipolar or multipolar circuit breaker, i.e., for rated operating voltages of up to 1 kV.

BACKGROUND OF THE INVENTION

It is known that loads or electrical networks that are to be protected using automatic circuit breakers comprise electrical conductors corresponding to the phases present, for example three, and possibly the neutral. A circuit breaker for the protection of loads or electrical networks normally comprises devices for making and breaking the main contacts, devices for detection of the currents that traverse it, protection devices, and automatic tripping devices.

The protection devices can normally be of a thermal, magnetic, magnetothermal type, or else of an electronic type.

Operation of protection devices of an electronic type is normally based upon the analysis of signals indicating the currents corresponding to the conductors. Said signals are generated by current-detection devices, technically referred to as current transducers. A low-voltage circuit breaker traditionally uses at least one transducer for each phase, and optionally also one for the neutral. The electronic protection device analyses the signals coming from said transducers to deduce the values of the currents circulating in the conductors. According to said values, the same protection device can generate a command, which, for example via an automatic-tripping solenoid, brings about opening of the contacts of the circuit breaker itself.

Protection devices of an electronic type require electrical supply. For this purpose, the current transducers themselves are usually exploited, but not always with altogether satisfactory results.

Amongst the transducers present in the known art, there may be cited amperometric transformers (internationally referred to as "current transformers" or CTs), Rogowski coils and Hall-effect sensors.

The most commonly used transducers are CTs, which have the prerogative of enabling provision of the so-called self-supply of the protection device. In fact, the output in the form of current, or amperometric output, generated by them, with the main purpose of making it possible to deduce the currents circulating in the protected electrical circuit, is generally characterized by a level of energy that is sufficient even to supply the protection device and the automatic-tripping solenoid.

A decidedly critical limit of CTs in their dual use as current transducers and power-supply units for supplying protection devices lies in the fact that, for high values of the currents circulating in the conductors which are to undergo measurement, the currents generated in the secondary windings and used for supplying the protection devices can markedly exceed the range of optimal operation of the protection devices, and in particular of the electronic circuits. This fact renders necessary the use of special dissipating means, the overall dimensions, weight and cost of which renders them far from compatible, above all in uses for small circuit breakers.

Another limit of this category of transducers is linked to the so-called phenomenon of saturation inherent in the nature of the ferromagnetic materials forming the cores of the windings. Saturation manifests itself with the decay of the linearity of the signal generated at high values of the currents circulating in the conductors undergoing measurement.

Other disadvantages of current solutions comprising CTs as power-supply units and measurement devices are represented by: the possibility of operating only in alternating current, hence precluding the uses in circuits traversed by a d.c. current or a current at a very low frequency; the considerable size of the devices; the heating that is caused; and the functional rigidity linked to the limited possibilities of calibration.

Solutions that are alternative and already present in the known art use the aforementioned Hall-effect sensors or Rogowski coils. These transducers afford marked accuracy and linearity of response, and hence, in the ultimate analysis, enable greater efficiency of the protection device.

Also these latter solutions present, however, considerable limitations as regards the supply of the electronic protection device. The first limit lies in the fact that the energy associated to the signal generated by them is not generally sufficient to ensure supply of the protection device and of the automatic-tripping solenoid directly. It follows that it is usually necessary to use sources of external supply to supply the protection device; in particular, an intrinsic limit of Hall-effect sensors lies in the fact that said sensors have to be supplied.

Also in the case of circuit breakers and similar switches that use these latter types of transducers, tests have in any case been conducted, and different solutions have been proposed, which in certain cases have demonstrated a good functionality, but in practical use none of them has provided totally satisfactory results, above all from the economic standpoint.

SUMMARY OF THE INVENTION

The main aim of the present invention is to provide a device for supplying an electronic protection device to be used in a low-voltage circuit breaker that will enable the drawback mentioned above to be overcome, thus improving the overall functionality. Within this aim, a purpose of the present invention is to provide a device for supplying an electronic protection device, which will be made up of a reduced number of components of simple construction, which can also be conveniently coupled to one another.

Another purpose of the present invention is to provide a supply device that will enable the electronic protection device and possibly other electrical and electronic components present to be supplied, such as for example the automatic-tripping devices (solenoids), or other possible accessories comprised in the automatic circuit breaker.

A further purpose of the present invention is to provide a device for supplying an electronic protection device for low-voltage circuit breakers, which, as compared to the solutions of a known type, will make it possible, in a constructionally simple and technically accurate way, to take the energy necessary for supply of a protection device for low-voltage circuit breakers within the circuit breaker itself directly from the electrical network on which it is installed.

Still another purpose of the present invention is to provide a device for supplying an electronic protection device for low-voltage circuit breaker that will present high reliability and can be manufactured conveniently and at competitive costs.

Thus the present invention relates to a supply device (1) for supplying a protection device to be used in a low-voltage circuit breaker, comprising: a first magnetic circuit (10) with closed development designed to surround a primary conductor (11) for a phase protected by said protection device; a secondary winding (12) having as core a stretch of said first magnetic circuit (10); a second magnetic circuit (20) structurally separated from said first magnetic circuit (10), said second magnetic circuit (20) being operatively associated to said first magnetic circuit (10) in such a way that, in operating conditions, at least one portion of the main magnetic flux generated in said first magnetic circuit (10) by the current circulating in the primary conductor will be absorbed by said second circuit in a proportion depending upon the value of the current itself.

Thanks to its innovative conception, the device for supplying an electronic protection device according to the invention allows to generate signals that are perfectly compatible with the protection devices via a relatively reduced number of components and without resorting to complicated magnetic circuits with complex geometry or which are complicated from a constructional standpoint.

For a better understanding of the present invention, reference is made to the accompanying drawings and to the detailed description hereinafter, in which preferred but non-limitative embodiments of the differential pressure transmitter according to the present invention are illustrated.

DESCRIPTION OF THE PREFERRED EMBODIMENTS

Figure 1:
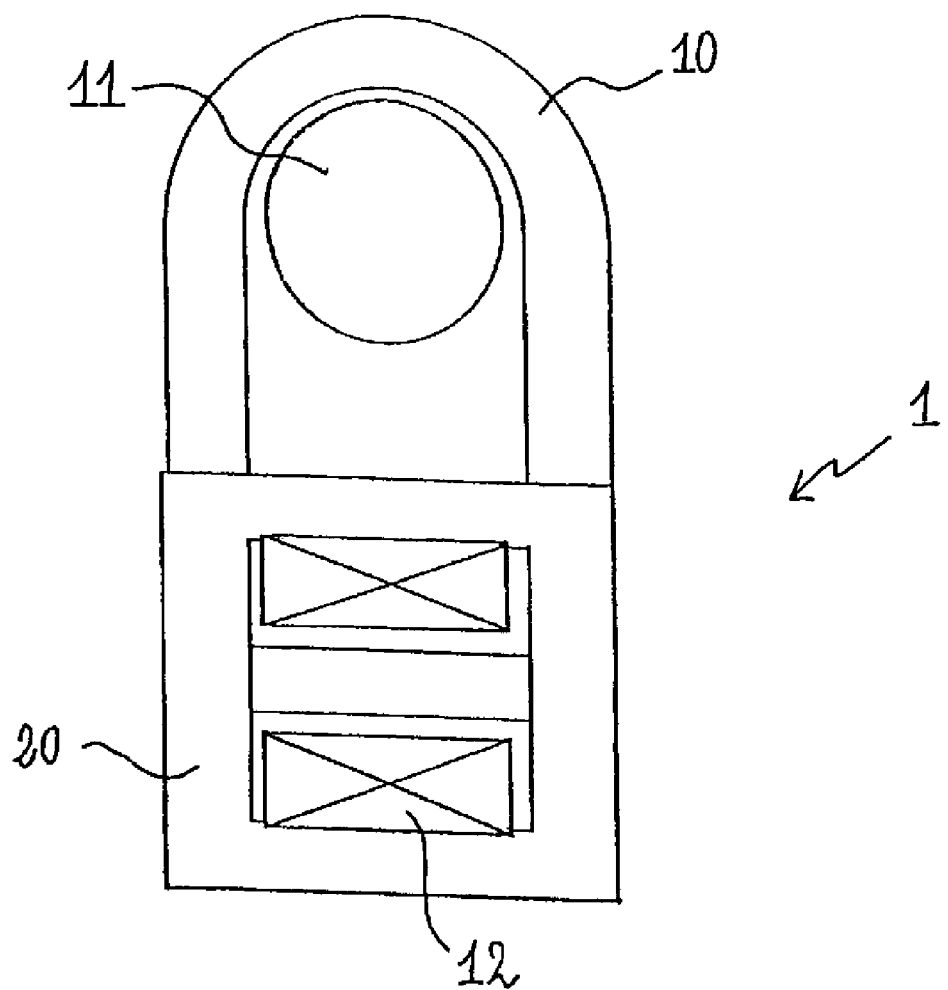
FIG. 1 is a schematic representation in a plan view of a first embodiment of the device for supplying an electronic protection device according to the invention.
Figure 1D:
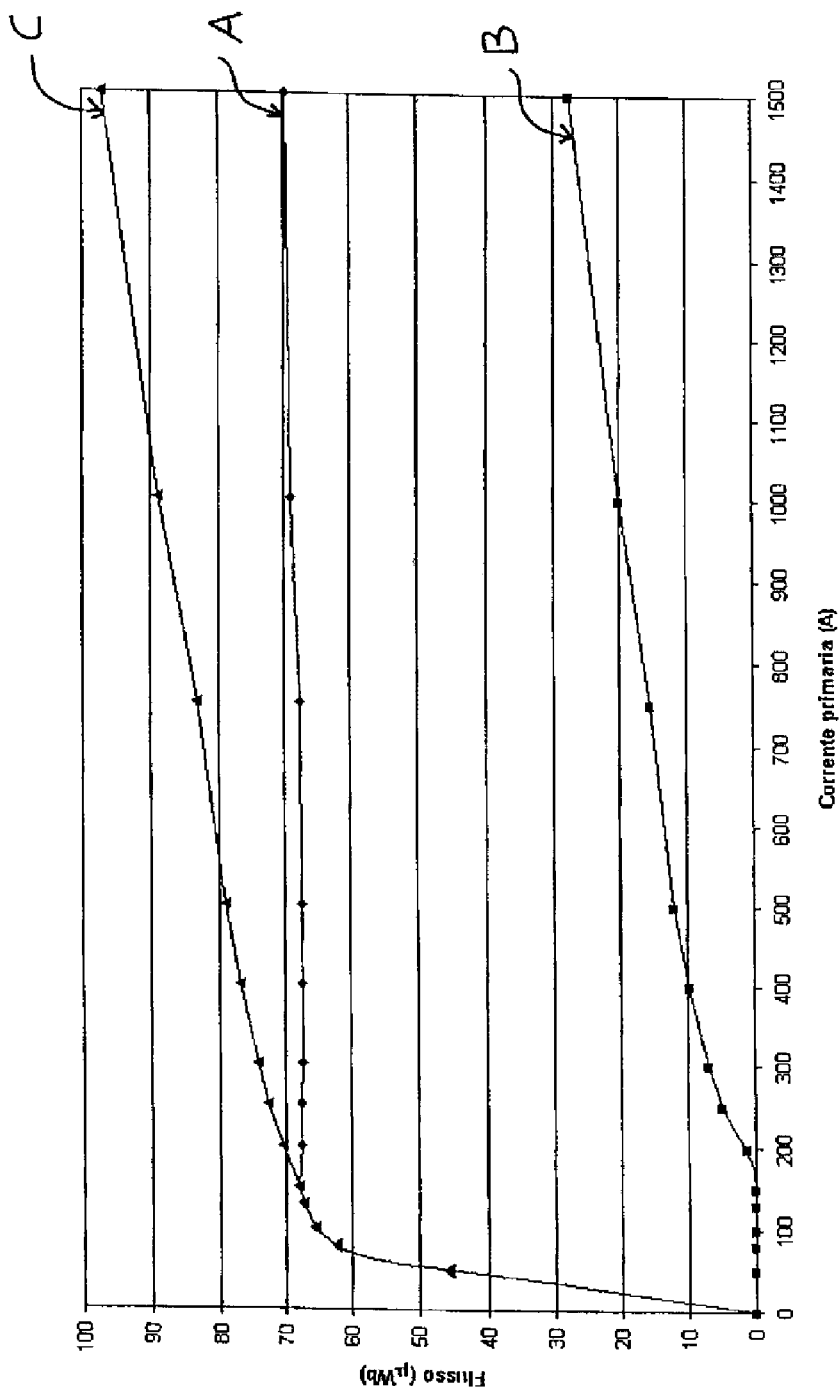
FIG. 1a represents the graph of the magnetic flux, as a function of the primary current of the phase that is protected, circulating within the main components of the supply device according to the invention.

With reference to the aforesaid figures, the supply device 1 according to the invention comprises a first magnetic circuit 10, preferably having a closed development, made up of a plurality of plane metal laminas packed together. As illustrated in FIG. 1, the first magnetic circuit 10 is arranged so as to surround a primary conductor 11 corresponding to a phase protected by an electronic protection device, associated to which is the supply device 1 itself. Said phase belongs to the electrical circuit, inserted in which is the low-voltage circuit breaker that uses the device 1. In turn, the protection device can be constituted, for example, by an electronic relay of a type widely known in the art, which will therefore not be described any further herein or illustrated in the figures.

Around a stretch of the first magnetic circuit 10, a secondary winding 12 is wound, which has the function of generating, across its terminals, the electrical signal that is preferably to supply the protection device. This stretch of the first magnetic circuit 10 basically constitutes the core of the winding 12 in a way similar to what occurs in a normal solenoid.

The supply device is characterized in that it comprises a second magnetic circuit 20, which is structurally separated from the first magnetic circuit 10. The term "structurally separated" is meant to indicate that the two circuits are geometrically independent of one another, are made on distinct pieces, and are such as not to be one a derivation or a portion of the other. The two circuits are operatively connected to one another in such a way that at least one part of the magnetic flux circulating in the first circuit 10 will be intercepted and absorbed by the second magnetic circuit 20. In particular, as the current in the primary conductor 11 increases, said first magnetic flux progressively tends to propagate also in the second circuit 20. In this way, a variable proportion of the flux generated by the current circulating in the primary conductor 11 will circulate in the second magnetic circuit 20. In particular, the proportion of flux in the second circuit 20 increases as the value of the current circulating in the primary conductor 11 increases, whilst the proportion of flux in the first circuit 10 decreases as the value of the current circulating in the primary conductor 11 increases.

In practice, the current that flows in the conductor 11 generates in any case a first magnetic flux that circulates in the first magnetic circuit 10, but as said current increases there progressively starts to form also a second magnetic flux in the second magnetic circuit 20. Of these two magnetic fluxes, only the first is operatively linked to the secondary winding 12, and hence the amperometric signal depends only upon this. Said amperometric signal must be such as, on the one hand, to enable sufficient supply of the electronic protection device in conditions of low currents in the primary conductor 11, whilst on the other hand, it must, however, be limited in conditions of high currents in the primary conductor 11, with the purpose of not overstepping the optimal range of compatibility with the electronics of the protection device to which the terminals of the winding 12 are connected. The second magnetic circuit 20, which is operatively connected to the first circuit 10, enables limitation of the amperometric signal by subtracting a portion of the first magnetic flux that generates it.

In particular, the second magnetic circuit 20 is operatively connected to the first magnetic circuit 10 in such a way as to enable absorption of a first part of the magnetic flux before this traverses the core of the secondary winding 12. Preferably, the second circuit 20 is operatively connected to the first circuit 10 by being arranged in the proximity of the secondary winding 12.

This operative connection produces a behavior of the supply device that is clearly visible from the graph of FIG. 1a. The curve A indicates the graph of the first magnetic flux as a function of the primary current that traverses the primary conductor 11 within the core, i.e., of the stretch of the first magnetic circuit 10 on which said secondary winding 12 is wound. the curve B represents the graph of the second magnetic flux circulating in the second magnetic circuit 20; whilst the curve C represents, instead, the amount of the total magnetic flux given by the sum of the previous ones. As may be noted, as the primary current increases, the flow that is absorbed by the second magnetic circuit 20 increases, whilst the flow circulating in the core of the secondary winding 12 tends to maintain itself at a substantially constant level. This advantageously enables an amperometric signal to be obtained across the secondary winding 12 that is substantially constant throughout the range that is characteristic of the current in the primary conductor 11.

This arrangement is particularly advantageous in so far as it enables improved operation of the supply device 1, at the same time enabling easier assembly of the parts and an optimized occupation of the spaces available.

Figure 2:
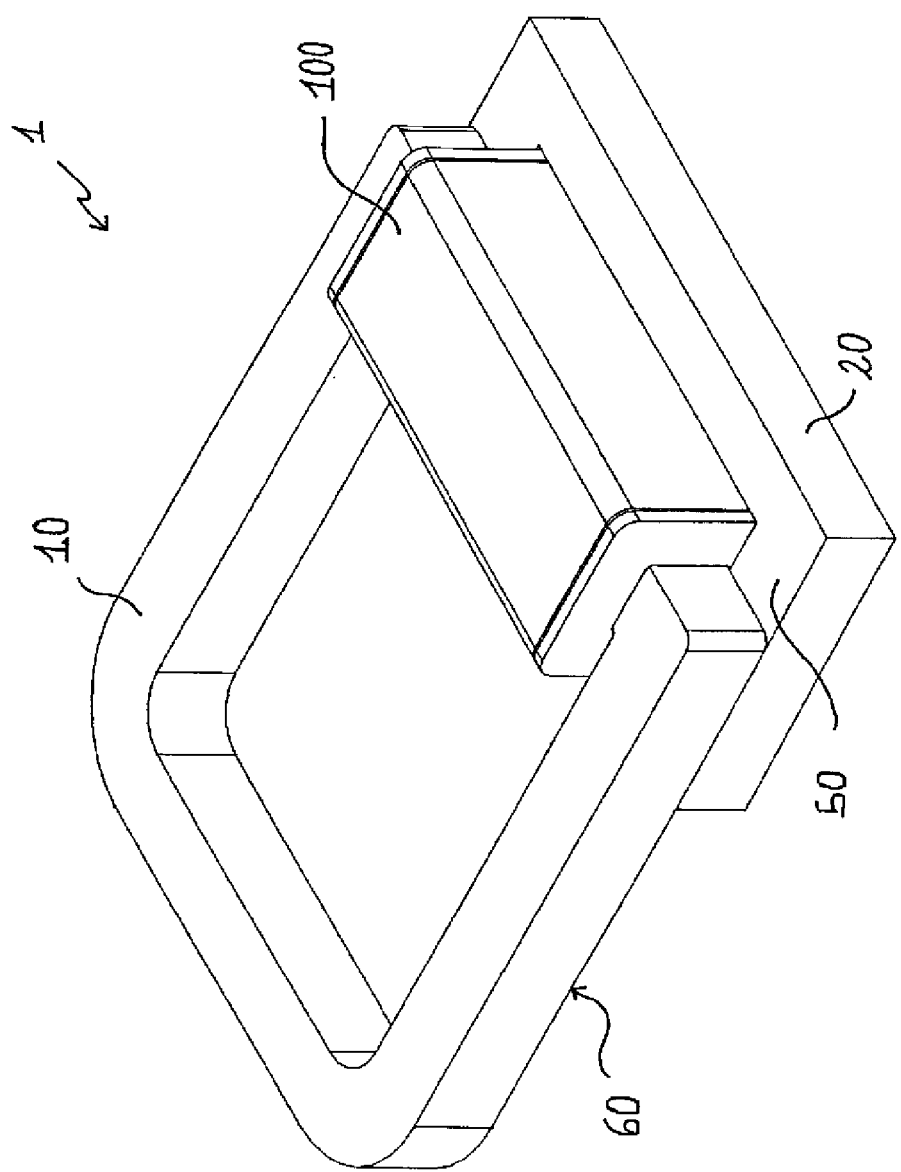
FIG. 2 is a perspective view of the device of FIG. 1.

FIG. 2 is a perspective view illustrating a first embodiment of the supply device 1 according to the invention (for simplicity of illustration the primary conductor 11 has been omitted). In this solution, also the second magnetic circuit 20 is made up of a plurality of plane packed metal laminas and assumes a closed configuration. According to a particularly preferred embodiment, the second magnetic circuit 20 is arranged around the secondary winding 12 so as to envelop it. Also the second circuit 20 develops according to a plane, substantially loop, configuration, in a way similar to the configuration of the first magnetic circuit 10. By "plane configuration" is meant a three-dimensional configuration, in which, however, two dimensions are markedly larger than the third, thus enabling identification of a "mean development plane of reference".

With reference once again to FIG. 2, the second magnetic circuit 20 develops and is set on a mean plane substantially adjacent to a second mean plane, in which said first magnetic circuit 10 is set and develops. The operative connection between the two circuits is obtained in this case through at least one first substantially parallel surface intermediate with respect to said first and said second planes.

According to a preferred embodiment, the second magnetic circuit 20 is operatively connected to the first magnetic circuit 10 through a second top surface thereof 50, which is magnetically coupled, in at least two areas, with a third bottom surface 60 of the first magnetic circuit 10. In particular, the two areas of coupling can be advantageously identified at the end of the secondary winding for the purpose of creating a by-pass for the passage of the magnetic flux.

Figure 2A:
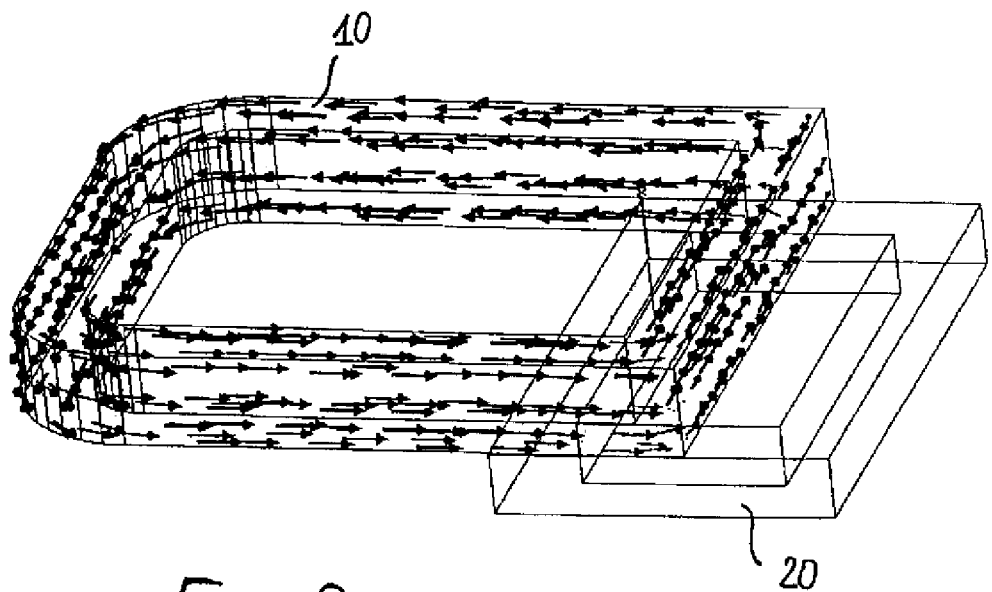
FIGS. 2a and 2b are schematic representations of the magnetic fluxes circulating within the main components of the supply device indicated in FIG. 2.
Figure 2B:
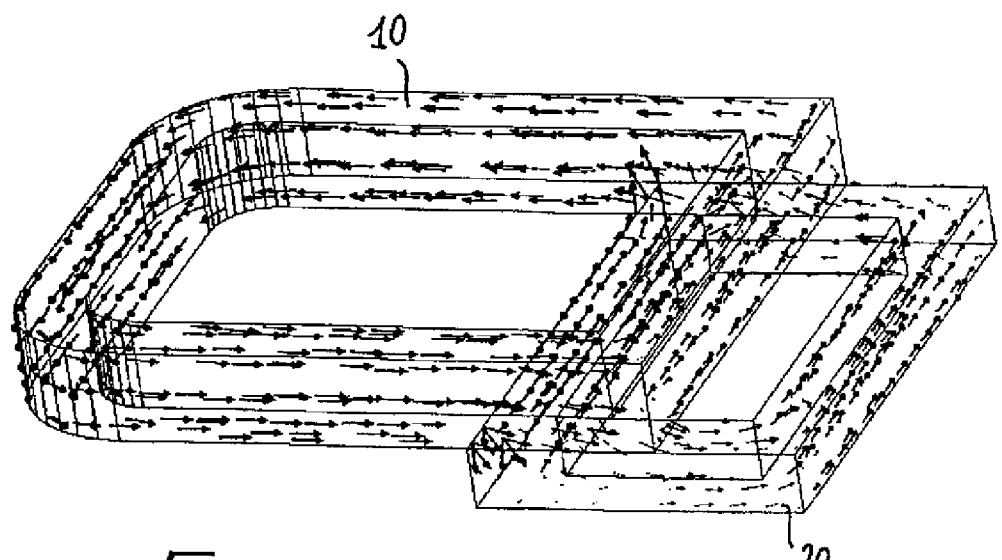

FIGS. 2a and 2b are schematic representations of the behavior of the magnetic fluxes circulating in the first magnetic circuit 10 and in the second magnetic circuit 20. In particular, FIG. 2a relates to conditions of operation characterized by a low current circulating in the primary conductor 11, whilst FIG. 2b relates to conditions of operation with higher currents. These latter two figures are to be interpreted also in the light of what is represented in the diagram of FIG. 1a already referred to previously. For low currents, the second magnetic circuit 20 does not absorb (or absorbs only to a negligible extent) any part of the first magnetic flux circulating in said first magnetic circuit 10. In such conditions, the first magnetic flux tends to circulate completely within the first magnetic circuit 10 since the magnetic reluctance of the latter is low. For increasing values of the currents circulating in the primary conductor 11, the first magnetic circuit is progressively saturated, and its own magnetic reluctance increases. The first magnetic flux thus tends to follow the path, which under these conditions opposes the smaller reluctance, thus exploiting also the natural alternative path made up of the second magnetic circuit 20, basically giving rise to the second magnetic flux, as represented in FIG. 2b.

As emerges clearly from FIG. 2b, in at least one of the areas of coupling between the two magnetic circuits, the first magnetic flux is intercepted and undergoes a localized deviation in the direction of the second magnetic circuit 20. The second magnetic flux (see the corresponding magnetic lines of flux) thus generated hence moves parallel to said first magnetic flux, but on a different mean plane (or more precisely in the various parallel planes of the respective metal laminas). In the passage from the circuit 10 to the circuit 20, the magnetic lines of flux, as illustrated in FIG. 2b, follow a path with at least one component substantially orthogonal to the direction in the horizontal plane of the packed metal laminas. Consequently, at least one component of these deviated lines of flux traverses perpendicularly the plane of the metal laminas of the two circuits 10 and 20, thus overcoming the natural magnetic gaps constituted by the spaces between the metal laminas within each of the magnetic circuits 10 and 20 and between the circuit 10 and the circuit 20, thus giving rise to the desired effect of weighted subtraction of flux on the basis of the value of the current.

Furthermore, the coupling between the surfaces of the magnetic circuits 10 or 20 can occur in a direct way, i.e., with the two magnetic circuits resting on one another, or else, when technically more convenient, also through the interposition of elements of interface constituted, for example, by diamagnetic material. Also in this case, we find that the passage of the magnetic flux from the first magnetic circuit 10 to the second magnetic circuit 20 is favored when there are high currents in the primary conductor 11, whilst it is inhibited when there are modest currents in the primary conductor 11. This proves advantageous when there are modest currents, i.e., when all the magnetic flux must circulate substantially only in the first magnetic circuit 10 to guarantee, across the secondary winding 12, an amperometric signal sufficient to enable operation of the protection device. In general, in any case said elements of interface can be made of different materials with different thicknesses, in this way enabling as many different effects to be obtained according to the aforesaid purposes.

Figure 2C:
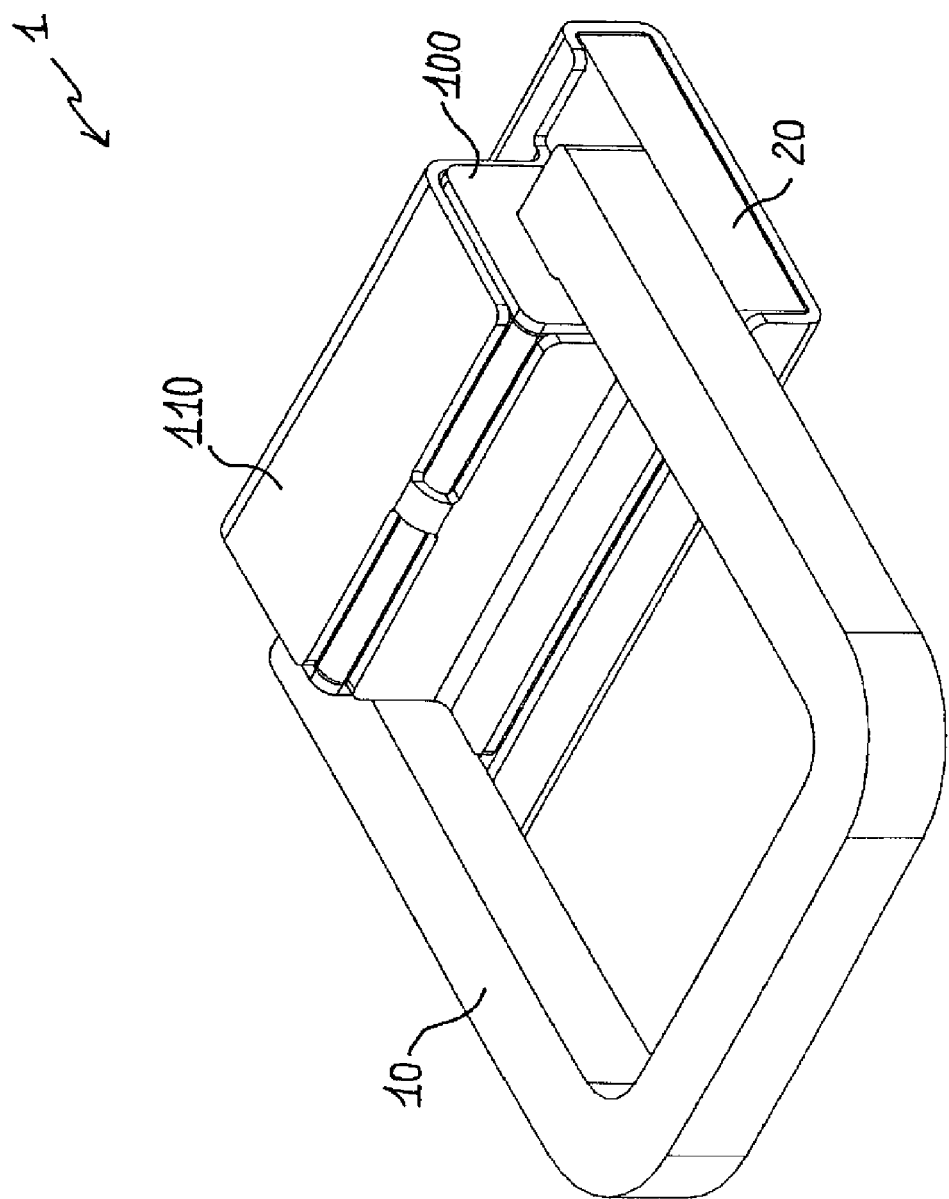
FIG. 2c is a perspective view of the supply device of FIG. 2, in accordance with a second embodiment.

As illustrated in FIG. 2c, the supply device 1 according to the invention may further comprise a first containment element 100, for example made of appropriate magnetic material, designed to receive the secondary winding 12 and the corresponding core portion. In addition, there are provided means for mutual positioning of the first magnetic circuit 10, of the second magnetic circuit 20, and of the first containment element 100. Said means for mutual positioning can be made in a single body or in a number of separate bodies. The element 100 has the purpose of containing the secondary winding 12 and the core part, and hence develops in a similar way, i.e., with a profile geometrically mated with the profile of the winding 12 so as to envelop it completely.

In particular, the means for mutual positioning comprise a cover 110, which is designed to surround and fix said second magnetic circuit 20 and said first containment element 100. Said cover 110 is shaped so as to follow the profile of the assembled parts, with the purpose of surrounding them on the outside, preventing relative movements between them. With this solution the overall volumetric dimensions are limited, at the same time guaranteeing an effective fixing in place.

Figure 5:
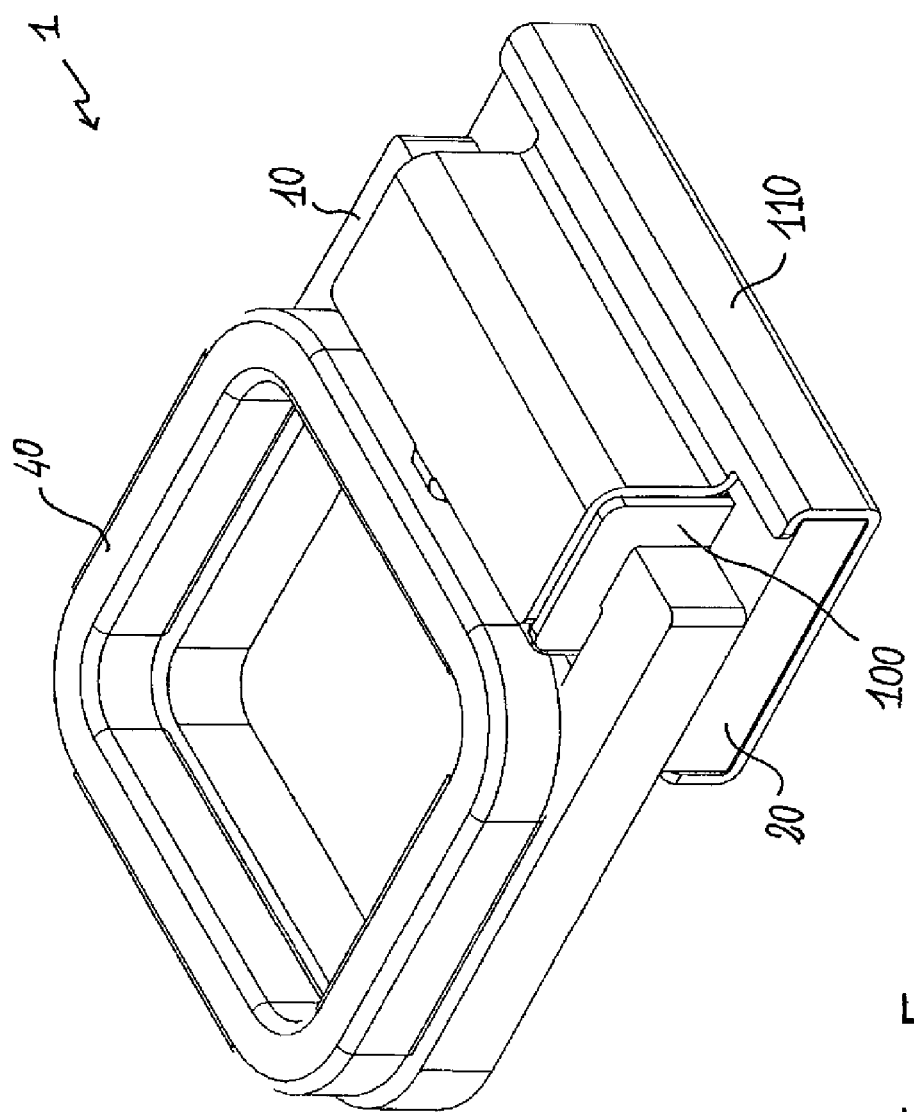
FIGS. 5 and 5a are perspective views of possible embodiments of a supply device according to the invention.
Figure 5A:
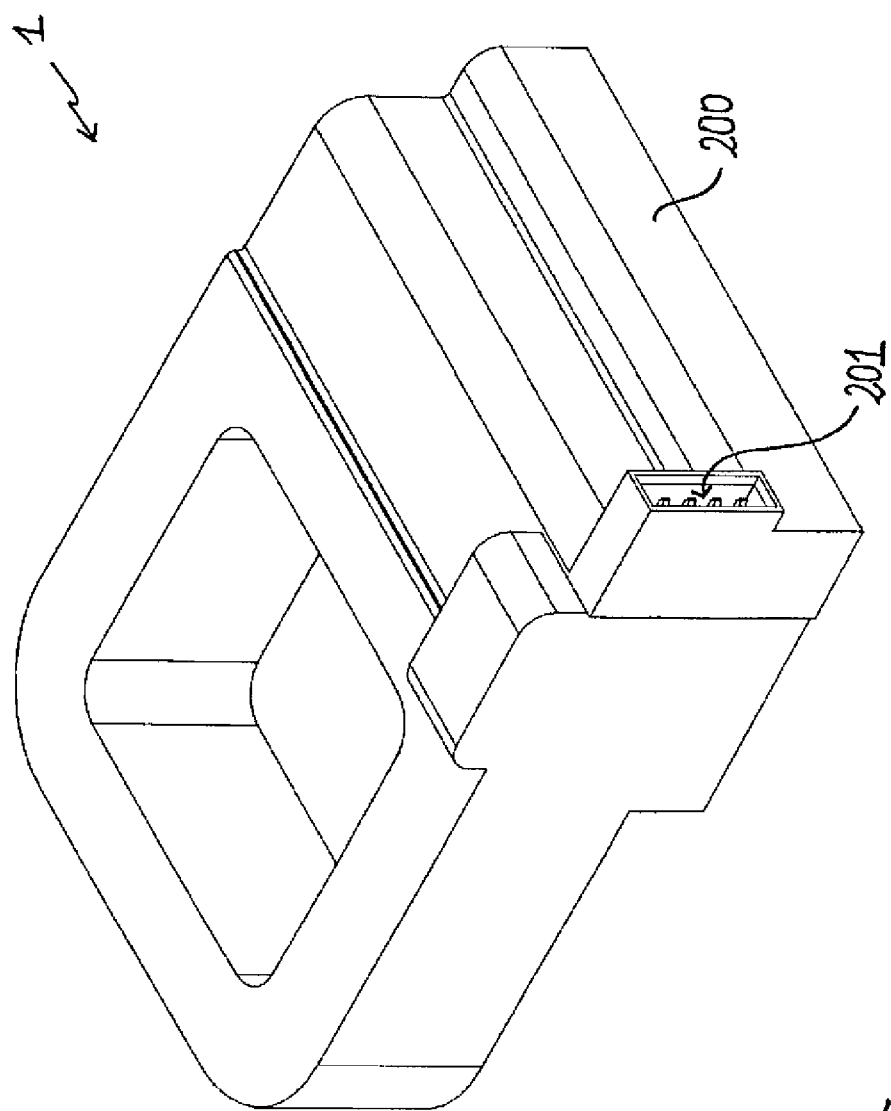

As illustrated in FIG. 5a, the supply device 1 according to the invention can preferably comprise also a second container 200, designed to house said first magnetic circuit 10, said second magnetic circuit 20, said secondary winding 12, said first containment element 200, and said means for mutual positioning. Said second container 200 basically constitutes a casing, designed to enclose all the components forming the supply device 1. This enables provision of compact, sturdy, and easily assembled devices of limited overall dimensions.

The second container 200 also comprises a first opening 201, designed to allow passage of the electrical connections of the secondary winding 12 so as to enable the supply device 1 to provide the amperometric output necessary for operation of the protection device to which it is associated.

Figure 3:
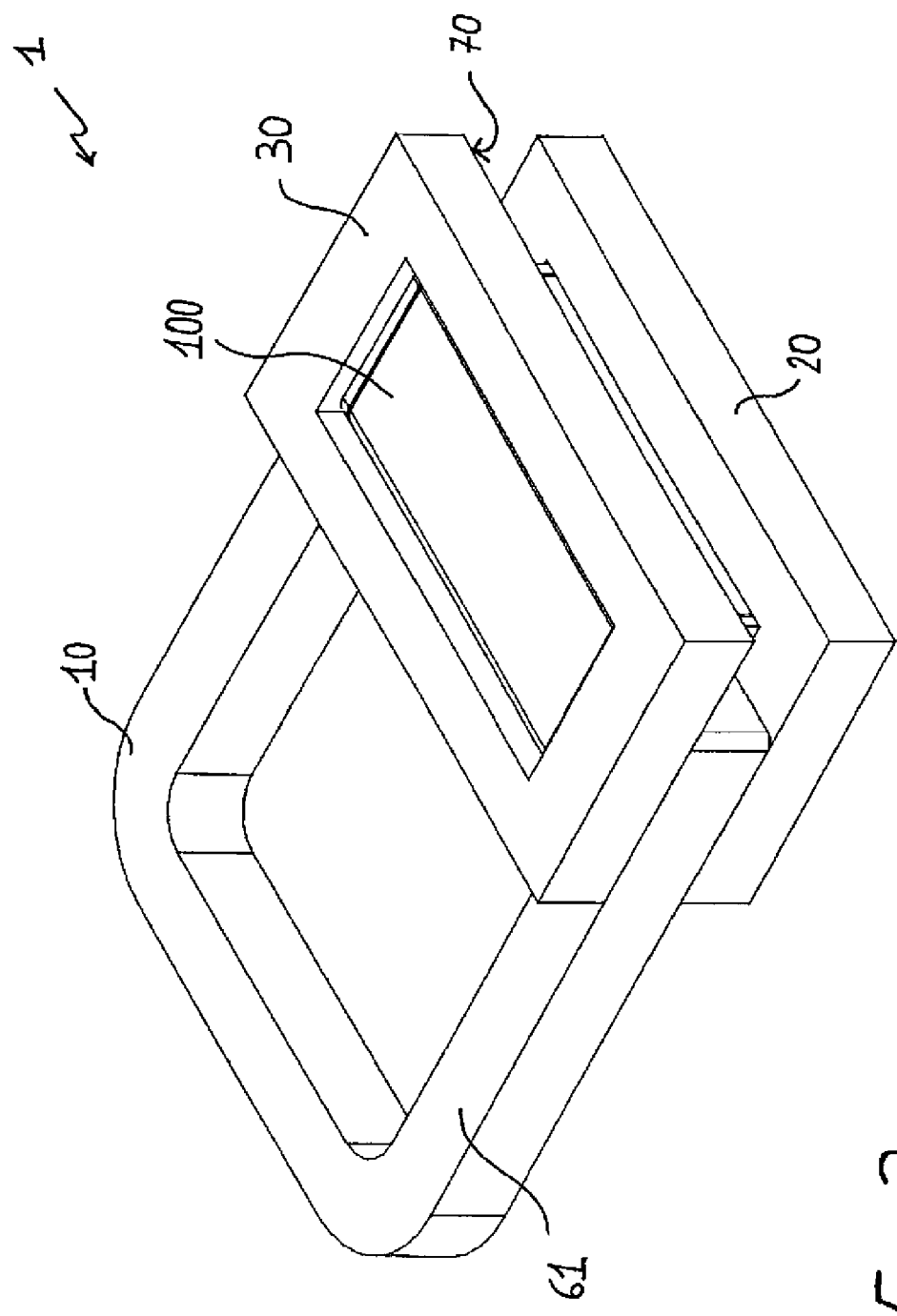
FIG. 3 is a perspective view illustrating a third embodiment of the supply device according to the invention.

FIG. 3 is a perspective view of a third embodiment of the supply device 1.

In this case, the device 1 comprises a third magnetic circuit 30, which is structurally separated from the first magnetic circuit 10 and from the second magnetic circuit 20. Also in this case, the third magnetic circuit 30 is operatively connected to the first magnetic circuit 10 with the purpose of carrying out the same function of absorption of the first magnetic flux carried out by the second magnetic circuit 20. In particular, the third magnetic circuit 30 absorbs a second part of the first magnetic flux, generating within it a third magnetic flux. Preferably, the third magnetic circuit 30 presents the same constructional characteristics as the second magnetic circuit 20; namely, it is made up of a series of packed plane laminas and develops according to a plane, substantially loop, configuration. Advantageously, said third magnetic circuit 30 is located on a third plane adjacent to said first and said second planes, on which there are set, respectively, said first magnetic circuit 10 and said second magnetic circuit 20, in a position that is substantially symmetrical to the second magnetic circuit 20 with respect to the first magnetic circuit 10. In this way, it is possible to obtain a still more marked effect, but once again with limited overall dimensions.

The operative connection between the third magnetic circuit 30 and the first magnetic circuit 10 can advantageously be obtained through a fifth bottom surface 70 of the third magnetic circuit 30, which is coupled in at least two areas with a sixth top surface 61 of said first magnetic circuit 10.

Figure 4:
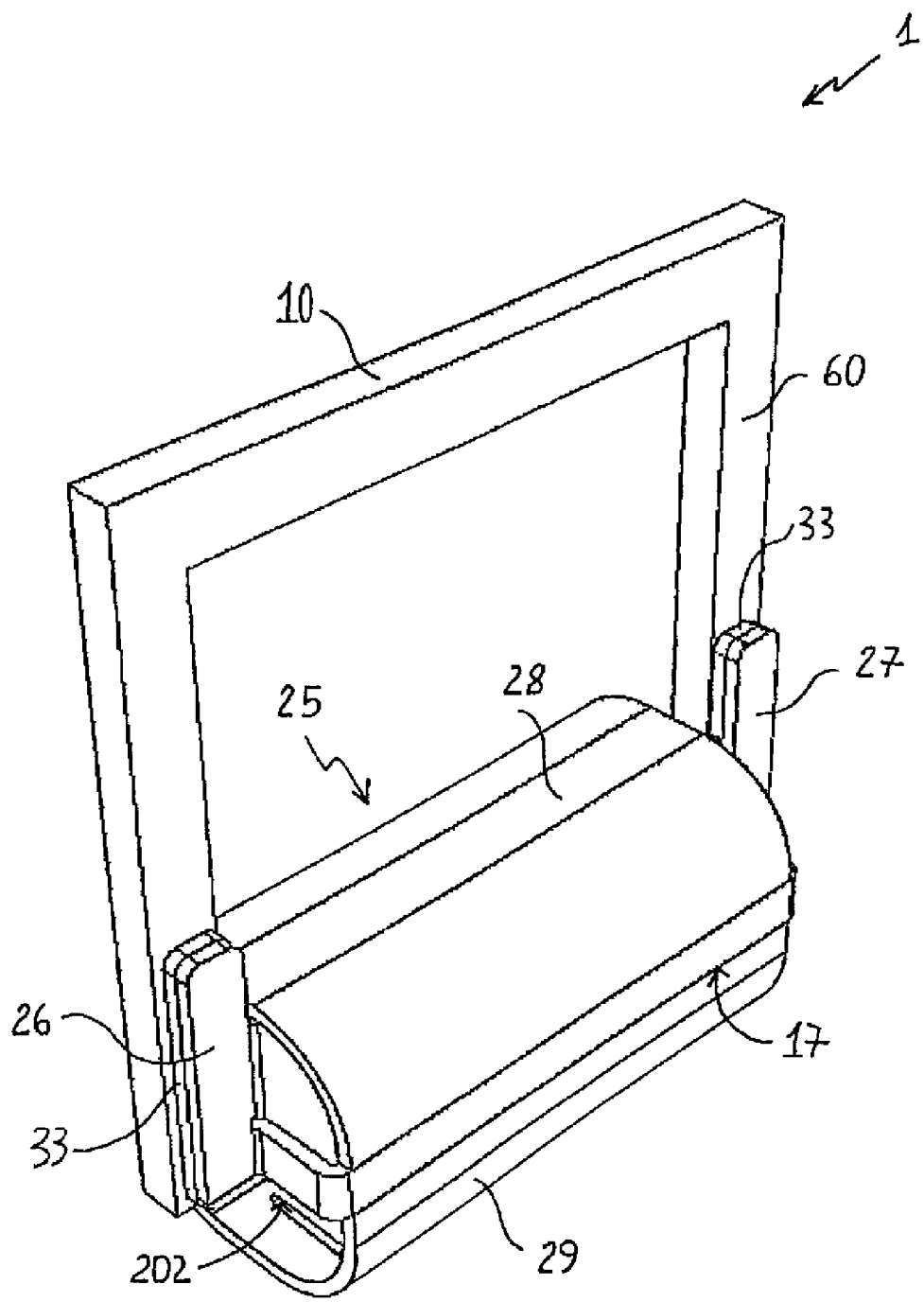
FIG. 4 is a perspective view of a fourth embodiment of the supply device according to the invention.
Figure 4A:
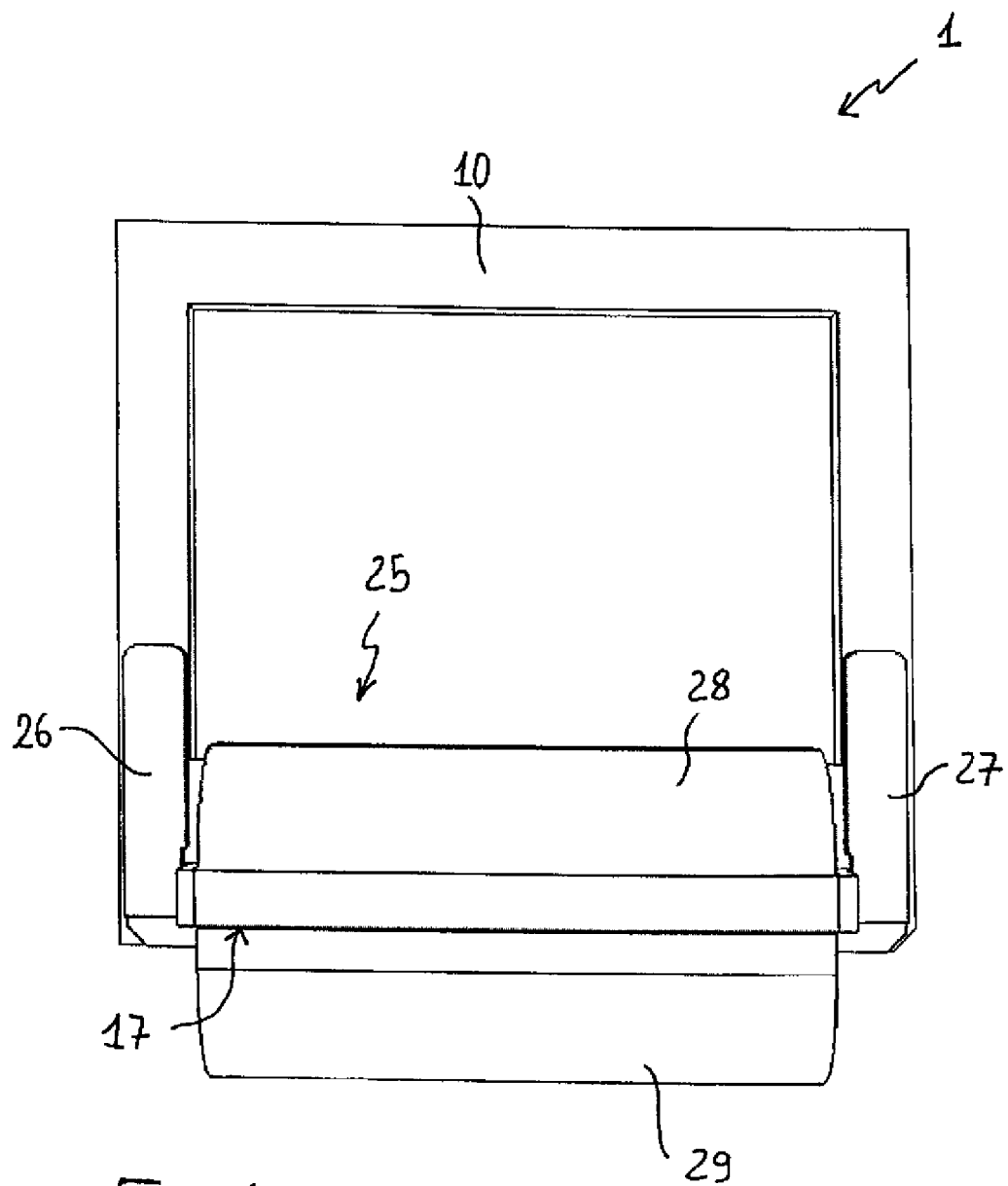
FIG. 4a is a front view of the device illustrated in FIG. 4.

FIGS. 4 and 4a regard a further embodiment of the supply device 1 according to the invention. This further solution is distinguished in that the function which was before performed by the second magnetic circuit 20 is now performed via a second magnetic circuit 20 with open configuration, such as to have a hollow central body 25, from which there emerge a first fin 26 and a second fin 27, set in positions opposite to one another.

The central body 25 is made hollow so as to surround and contain said secondary winding 12. Its substantially shell-like shape enables a further limitation of the dimensions so as to enable the use of the device 1 also in protection apparatuses having small dimensions or in any case with limited available spaces. The central body 25 can be made up of a first half-shell 28 set alongside a second half-shell 29, so that the contact between the two half-shells will be made only on one side and so that along the other side the two flaps are kept spaced apart by an opening 17, with the purpose of preventing formation of an undesirable electrical turn. The central body 25 can be constituted alternatively by a single body appropriately shaped so that there will in any case be present an opening 17. Said opening 17 can be left empty or else conveniently filled with spacer means made of insulating material.

The central body 25 is open on the sides of the secondary winding 12, where there is provided an opening 202, which is designed to enable passage of the electrical connections of the secondary winding 12 itself.

The two fins 26 and 27 referred to above have the function of enabling operative connection of the second magnetic circuit 20 with said first magnetic circuit 10, with the purpose of intercepting the first magnetic flux in conditions of increasing primary currents, in a way similar to what was described previously. In particular, said fins 26 and 27 provide the magnetic coupling between the first magnetic circuit 10 and the second magnetic circuit 25 in a position corresponding to said top surface 61 (or alternatively to said third bottom surface 60) of said first magnetic circuit 10, substantially across the core of said secondary winding 12.

The first fin 26 and the second fin 27 can rest directly in contact with one of the above indicated surfaces of the first magnetic circuit 10, or else with the interposition of interface elements 33 made, for example, of diamagnetic material, as illustrated in FIG. 4a. Also in this embodiment, the first magnetic flux undergoes a localized deviation in the direction of the second magnetic circuit 20 in the proximity of said end in a way similar to what was described previously.

In the embodiment illustrated in FIG. 5, the supply device 1 according to the invention can preferably comprise at least one transducer 40, which is arranged in a position neighbouring upon the primary magnetic circuit 10, which provides a measurement of the value of current circulating in the associated conductor, in this case the conductor 11. For instance, said transducer 40 could be made up of a Rogowski coil, as illustrated in the figure, which is substantially set resting on a surface 60 or 61 of said first magnetic circuit 10 so as to surround the primary conductor 11. Alternatively, one or more Hall-effect sensors could be used, appropriately positioned with respect to the conductor 11.

In this case, the second container 200 may also advantageously contain said transducer 40, as illustrated in FIG. 5a, in this way enabling a protection device of extremely compact shape to be obtained, fixed and integral with respect to the supply device 1. In this case, the above-mentioned first opening 201 has the purpose of allowing also passage of the electrical connections of the transducer 40 for the purpose of enabling connection thereof, for example, with the protection device of the circuit breaker.

The second container 200 may be made up of two half-parts, which can be coupled to one another, made for example of plastic material, but it can also be directly co-moulded with one or more components of said supply device 1.

Clearly, the second container 200 can be used in an equivalent manner for the embodiments of FIGS. 3, and 4–4a, albeit with the shape modified.

With said solution, in practice the supply device 1 is made up of a single block that can be directly and conveniently inserted within the casing of the circuit breaker, which is already prearranged for operative use as integral part of the protection device. Consequently, the present invention also regards both an electronic protection device to be used in the fabrication of low-voltage circuit breakers and a moulded-case low-voltage circuit breaker of the type for industrial uses, commonly referred to in the art as "moulded-case circuit breaker", said electronic protection device and said low-voltage circuit breaker being characterized in that they comprise at least one supply device 1 according to the foregoing description.

The technical solutions adopted for the supply device enable the tasks and the purposes set forth above to be fully achieved. In particular, the supply device renders possible the generation of electrical currents perfectly compatible with the protection devices by means of a reduced number of components and without resorting to complicated magnetic circuits, through the entire range of currents that can circulate in the primary conductor. Furthermore, said results are obtained using components of simple shape and coupled together according to extremely simple and functionally effective constructional configurations.

The supply device thus conceived may undergo numerous modifications and variations, all of which fall within the scope of the inventive idea; moreover, all the items may be replaced by other technically equivalent ones.

What is claimed as new and desired to be protected by Letters Patent of the United States is:

1. A supply device for supplying a protection device to be used in a low-voltage circuit breaker, comprising:
    a first magnetic circuit comprising a closed flux path designed to surround a primary conductor of a phase protected by said protection device;
    a winding having a core comprising a portion of said first magnetic circuit;
    a second magnetic circuit structurally separated from said first magnetic circuit,
    said second magnetic circuit being magnetically coupled to said first magnetic circuit in such a way that, in operation, at least one portion of a main magnetic flux generated in said first magnetic circuit by a current in the primary conductor is absorbed by said second magnetic circuit in a proportion determined by a value of the current in the primary conductor; and
    a first containment element designed to receive said secondary winding.

2. The supply device according to claim 1, wherein said second magnetic circuit is magnetically coupled to said first magnetic circuit so as to absorb said proportion of the main magnetic flux before traversal of the main magnetic flux through said core of the secondary winding.

3. The supply device according to claim 1, wherein said second magnetic circuit is operatively connected to said first magnetic circuit in such a way as to envelop said winding.

4. The supply device according to claim 2, wherein said second magnetic circuit is operatively connected to said first magnetic circuit in such a way as to envelop said winding.

5. The supply device according to claim 1, wherein said first magnetic circuit and said second magnetic circuit are configured in the form of loops, respectively, along a first median plane and a second median plane set substantially parallel to one another, said first magnetic flux circulating in said first magnetic circuit substantially parallel to a portion of absorbed magnetic flux circulating in said second magnetic circuit.

6. The supply device according to claim 5, wherein said first and second magnetic circuits are operatively associated to one another so that said portion of absorbed flux, in the passage from the first magnetic circuit to the second magnetic circuit, will have at least one component directed substantially perpendicular to said first and second median planes of paths of the first and of the second magnetic circuits.

7. The supply device according to claim 1, wherein said second magnetic circuit is operatively connected to said first magnetic circuit through at least one first surface substantially parallel to said first and second median planes.

8. The supply device according to claim 7, wherein said second magnetic circuit is operatively connected to said first magnetic circuit through a second top surface thereof, which is in contact in at least two points with a third bottom surface of said first magnetic circuit.

9. The supply device according to claim 1, said supply device comprising a third magnetic circuit structurally separated from said first magnetic circuit and from said second magnetic circuit, said third magnetic circuit being magnetically coupled to said first magnetic circuit so as to absorb a further portion of said main magnetic flux.

10. The supply device according to claim 9, wherein said third magnetic circuit has a configuration that is the same as that of said second magnetic circuit, said second and third magnetic circuits being arranged facing one another in a symmetrical position with respect to said first magnetic circuit.

11. The supply device according to claim 5, said supply device comprising a third magnetic circuit structurally separated from said first magnetic circuit and from said second magnetic circuit, said third magnetic circuit being magnetically coupled to said first magnetic circuit so as to absorb a further portion of said main magnetic flux.

12. The supply device according to claim 11, wherein said third magnetic circuit has a configuration that is the same as that of said second magnetic circuit, said second and third magnetic circuits being arranged facing one another in a symmetrical position with respect to said first magnetic circuit.

13. The supply device according to claim 7, said supply device comprising a third magnetic circuit structurally separated from said first magnetic circuit and from said second magnetic circuit, said third magnetic circuit being magnetically coupled to said first magnetic circuit so as to absorb a further portion of said main magnetic flux.

14. The supply device according to claim 13, wherein said third magnetic circuit has a configuration that is the same as that of said second magnetic circuit, said second and third magnetic circuits being arranged facing one another in a symmetrical position with respect to said first magnetic circuit.

15. The supply device according to claim 1, wherein said second magnetic circuit develops according to an open configuration having a hollow central body positioned so as to surround at least partially said winding, wherein, on sides opposite to one another, a first fin and a second fin, which are designed to be positioned in surface contact, either direct or indirect, with corresponding surfaces of said first magnetic circuit.

16. The supply device according to claim 15, wherein said central body comprises two half-shells, separated by an opening directed along a line joining said first and second fins, wherein said opening contains an insulating material.

17. The supply device according to claim 1, further comprising means for mutual positioning of said first circuit, said second circuit, and said first containment element, said means for mutual positioning comprising a cover that rigidly surrounds said second magnetic circuit and said first containment element.

18. The supply device according to claim 1, further comprising at least one transducer that detects the current in said primary conductor and located in a position adjacent to said primary conductor.

19. The supply device according to claim 17, further comprising at least one transducer that detects the current in said primary conductor and located in a position adjacent to said primary conductor.

20. The supply device according to claim 19, further comprising a second container that houses at least said first and second magnetic circuits, said first containment element, said means for mutual positioning, and said transducer, wherein said second container includes at least one opening for passage of electrical connections.

21. A protection device for low-voltage circuit breakers, comprising a supply device according to claim 1.

22. A molded-case low-voltage circuit breaker, comprising at least one supply device according to claim 1.

* * * * *